(12) United States Patent
Dierickx

(10) Patent No.: US 6,683,360 B1
(45) Date of Patent: Jan. 27, 2004

(54) MULTIPLE OR GRADED EPITAXIAL WAFERS FOR PARTICLE OR RADIATION DETECTION

(75) Inventor: Bart Dierickx, Mortsel (BE)

(73) Assignee: Fillfactory, Mechelen (BE)

( * ) Notice: Subject to any disclaimer, the term of this patent is extended or adjusted under 35 U.S.C. 154(b) by 0 days.

(21) Appl. No.: 10/056,573

(22) Filed: Jan. 24, 2002

(51) Int. Cl.$^7$ ................................................ H01L 27/14
(52) U.S. Cl. ...................................... 257/428; 257/463
(58) Field of Search ............................... 257/428, 429, 257/439, 440, 450, 463; 250/338.1, 338.4, 352, 370.14, 341.4; 333/164

(56) References Cited

U.S. PATENT DOCUMENTS 4,630,011 A * 12/1986 Neider et al. ............... 333/164
6,259,099 B1 * 7/2001 Foulon et al. ......... 250/370.14

* cited by examiner

Primary Examiner—Wael Fahmy
Assistant Examiner—(Vikki)Hoa B. Trinh
(74) Attorney, Agent, or Firm—Barnes & Thornburg

(57) ABSTRACT

The present invention provides a particle or electromagnetic radiation sensor structure, comprising a substrate (13) having a major surface and a sensitive layer (16) on the major surface of the substrate (13), the sensitive layer (16) being sensitive to particle or electromagnetic radiation and having a first surface (17) remote from the substrate (13). The sensitive layer (16) has a doping concentration gradient from a higher doping level to a lower doping level, the doping concentration decreasing from the substrate (13) to the first surface (17) of the sensitive layer (16). According to an embodiment, over any distance across the sensitive layer (16) which is half of the thickness of the sensitive layer (16), the ratio between the highest doping level and the lowest doping level is at least a factor 2, preferably at least a factor 3 or more.

The present invention also provides a method for obtaining such a sensor structure, as well as arrays comprising such sensor structures.

17 Claims, 3 Drawing Sheets

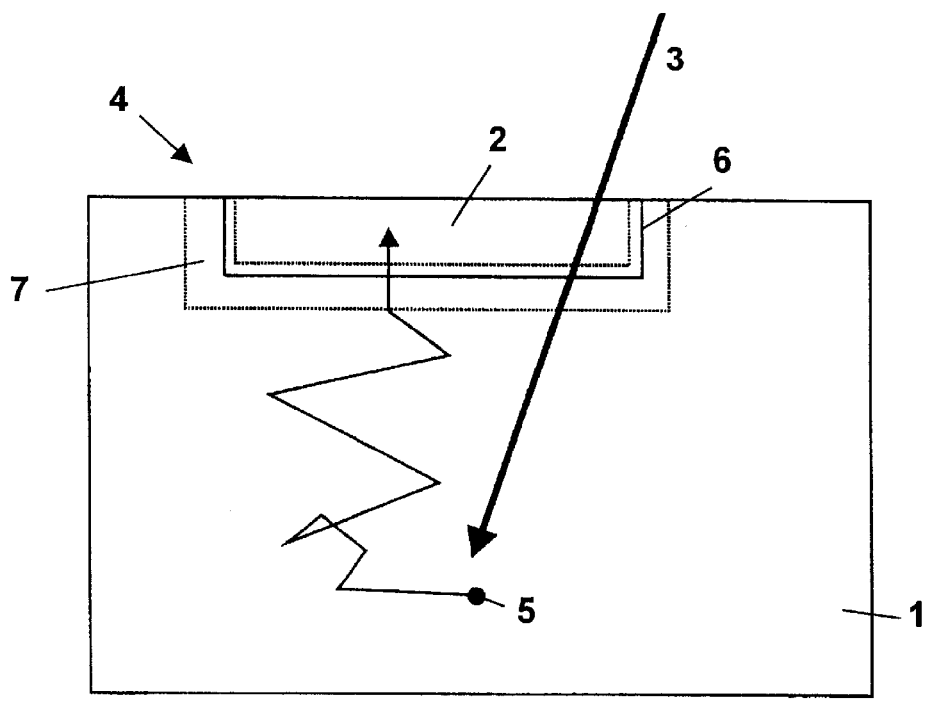
Fig. 1 - PRIOR ART
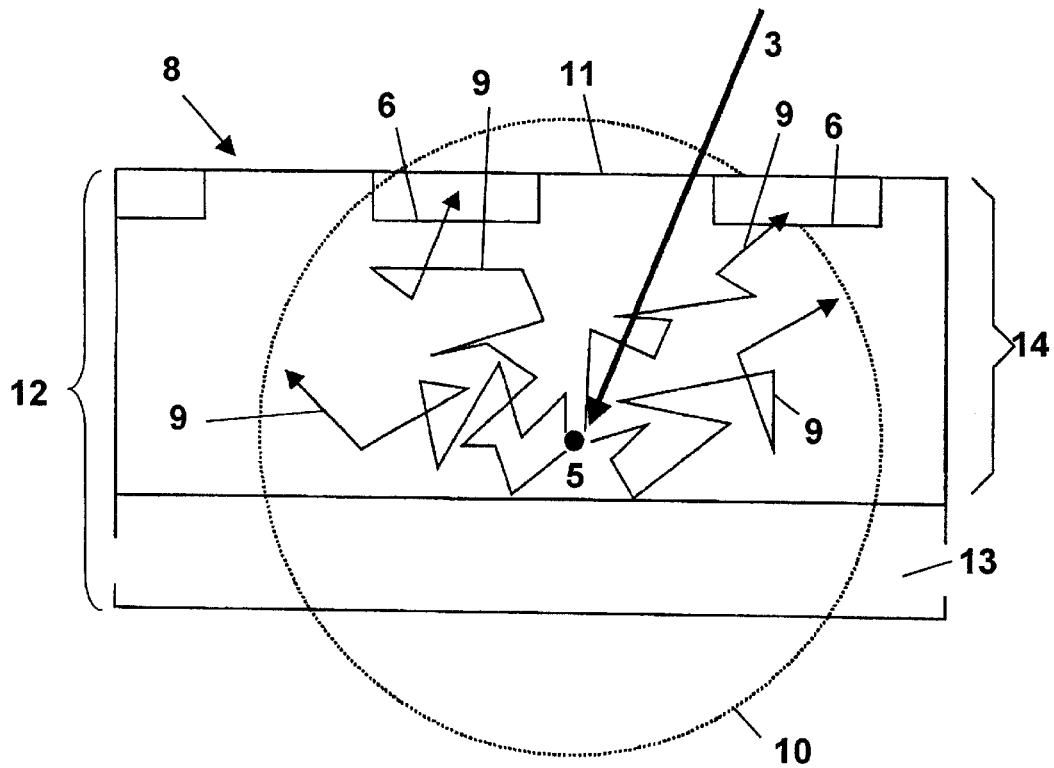
Fig. 2 - PRIOR ART

MULTIPLE OR GRADED EPITAXIAL WAFERS FOR PARTICLE OR RADIATION DETECTION

TECHNICAL FIELD OF THE INVENTION

The present invention relates to the field of semiconductor based sensors for detecting particles or electromagnetic radiation. In particular improved sensor structures for detecting particles or electromagnetic radiation with a high sensitivity are disclosed as well as a sensor comprising an array of such sensor structures. The present invention also relates to a method of manufacturing such sensor structures and sensors.

BACKGROUND OF THE INVENTION

Semiconductor based sensors and devices for detecting electromagnetic radiation are known in the art. Examples of such sensors are disclosed in WO 93/19489 and in EP-0739039. These sensors are implemented in a semiconductor substrate in CMOS- or MOS technology. In these sensors, the regions adapted for collecting charge carriers being generated by the radiation in the semiconductor substrate are forming a p-n or a n-p junction (diode) with the substrate that is of a n type conductivity or p type conductivity respectively. Such junctions are called collection junctions. In what follows, as an example, a p-type substrate 1 provided with an n-type collection region 2 is considered, as shown in FIG. 1.

Electromagnetic radiation 3, e.g. photons, impinging on the semiconductor pixel 4 is absorbed somewhere in the semiconductor material. By the absorption of the photon energy, an electron-hole pair is created. The majority carrier of this pair (a hole in case of the p-type semiconductor material) stays unnoticed in a sea of majority carriers already present in that material. The minority carrier 5 (in casu the electron) diffuses towards the junction 6, across the depletion layer 7 of the junction 6 and is collected by the region(s) 2 adapted for collecting charge carriers, thus realising a charge current of 1 electron.

Electrons 5 from the electron-hole pairs generated in the depletion layer 7 of the junction 6 are collected by the built-in electric field in the depletion layer 7. But also electrons 5 generated at considerable distance from the junction 6, outside the depletion layer 7, are collected. In fact all charges 5 generated within a so-called recombination length from the collection junction 6 have a chance of diffusing to that junction 6 and of being collected. Typically a depletion layer 7 is a few tenth of a μm wide, while the distance over which electrons 5 (minority carriers) can diffuse, before being recombined, is typically more than 10 μm. In most cases, the main detection volume of a photodiode 4 is outside the depletion layer 7.

In a pixel array 8, being an array of pixels for detection of electromagnetic radiation, in a situation where electrons 5 are generated deep in the semiconductor material, such as when generated by infrared light or X-rays, these electrons are collected by diffusion. Electrons diffuse through the semiconductor material in a random motion, as indicated by the arrows 9 in FIG. 2. This means that, during the time that electrons 5 diffuse upwards towards the junction 6, they also diffuse laterally in a random fashion. If the material is homogeneous, electrons 5 diffuse in a spherical fashion through the material, as indicated by the sphere 10. Therefore, the lateral diffusion of electrons 5 is of about the same distance as the vertical diffusion towards the junction

6. If an electron 5 is generated at a depth of e.g. 20 μm, which is not unlikely e.g. for near infrared light, this electron 5 can be expected to arrive at a surface 11 of the semiconductor material within an area with a diameter of 40 μm or more. This results in an apparent unsharpness in the image, as electrons 5 generated underneath a certain pixel, may be collected by another (neighbouring) pixel.

For this reason, typically homogeneous Silicon material is not suitable for the manufacturing of image sensors. In order to reduce the lateral diffusion of charges, epitaxial wafers 12 are used, as illustrated in FIG. 2. The bulk 13 of these wafers 12 is highly doped (e.g. highly doped p-type Silicon), so that no electrons 5 can exist in there (they almost immediately recombine with free holes), and they have a thin, e.g. 5 μm, lowly doped top layer (epitaxial layer 14). As this top layer 14 is thin, the vertical diffusion can happen over a short distance only (5 μm), and therefore the lateral diffusion can never become large. Nevertheless, for very small pitch pixels, e.g. 4 μm or even 3 μm, the lateral diffusion may be again in the order of the pixel pitch or larger, thus resulting again in unsharpness.

Roughly it can be stated that the unsharpness created by diffusion is about equal to the thickness of the epitaxial layer 14. Free electrons 5 will not penetrate into the bulk wafer 13, as this bulk wafer 13 is highly doped, and therefore there is an electrostatic barrier between the epitaxial layer 14 and the bulk wafer 13. Free electrons 5 will diffuse through the epitaxial layer 14 until one of the following conditions occurs:

(a) recombination, i.e. the free electron 5 meets a free hole, and they recombine into a bound electron, or (b) the electron 5 is caught by an n-type junction 6 (in case of a p-type substrate).

Of course only the second one of these events is of interest for the detection of electromagnetic radiation 3.

The junction 6 in the epitaxial layer 14 thus seems to have an inherent sharpness of about the same value as the thickness of that epitaxial layer 14. In order to make small pixels which are still sharp, in theory wafers with a thinner epitaxial layer 14 can be used. However, this shows the following disadvantages:

the thinner epitaxial layer reduces the photosensitive volume, which decreases the sensitivity, especially in the yellow, red and near infrared wavelengths, and the state of the art CMOS processes employ bulk wafers 12 or epiwafers with 5 μm thickness of the epitaxial layer 14; 4 μm and even 3 μm may be envisaged, but less is not compatible with CMOS processing, as the well- and tub-implants reach beyond 2 μm thickness, and in that case would touch the highly doped bulk Silicon material 13.

SUMMARY OF THE INVENTION

It is an object of the present invention to provide a sensor structure for detecting high energy particles or electromagnetic radiation, which has a good sensitivity, thus which has a sensitive volume which is large enough, and which does not present problems with deep implants touching the highly doped bulk material.

It is another object of the present invention to provide a sensor structure for detecting high energy particles or electromagnetic radiation, which has an increased sharpness while keeping the same sensitive volume as used in the prior art, or to provide a sensor structure for detecting particles or electromagnetic radiation with drastically increased sensitive volume while maintaining the same sharpness associated with a much shallower epitaxial layer as known in the prior art.

It is also an object of the present invention to provide an array of sensor structures for detecting high energy particles or electromagnetic radiation with increased sharpness.

It is yet a further object of the present invention to provide a method to obtain sensor structures for detection of high energy particles or electromagnetic radiation, these sensor structures having an increased sharpness.

The high energy particles to be detected are for example particles, such as α-particles, β-particles, γ-particles, nuclear or sub-nuclear particles. Electromagnetic radiation to be detected is for example cosmic rays, X-rays, ultraviolet light, infrared light and visible light.

The above objectives are accomplished by the devices and methods according to the present invention.

In first instance, the present invention provides a particle or electromagnetic radiation sensor structure, comprising a substrate having a major surface and a sensitive layer on the major surface of the substrate, the sensitive layer being sensitive to particle or electromagnetic radiation and having a first surface remote from the substrate. The sensitive layer has a doping concentration gradient from a higher doping level to a lower doping level, the doping concentration decreasing from the substrate to the first surface of the sensitive layer such that over any distance across the sensitive layer which is half of the thickness of the sensitive layer, the ratio between the highest doping level and the lowest doping level is at least a factor 2, preferably at least a factor 3 or more.

The thickness of the sensitive layer may at least be 3 microns.

According to a first embodiment, the sensitive layer comprises a plurality of sub-layers. This plurality of sub-layers may be epitaxial sub-layers. Each of those sub-layer may have a different doping concentration.

According to a second embodiment, the sensitive layer consists of a single layer with decreasing doping concentration.

The sensitive layer may have a continuously or gradually decreasing doping concentration or a stepwise decreasing doping concentration. The stepwise decreasing doping concentration may decrease step-wise monotonically.

In second instance, the present invention provides an array of sensor structures for detecting particles or electromagnetic radiation. Such an array comprises a plurality of sensor structures, and each sensor structure comprises a substrate having a major surface, and a sensitive layer on the major surface of the substrate, the sensitive layer being sensitive to particle or electromagnetic radiation and having a first surface remote from the substrate. The sensitive layer has a doping concentration gradient from a higher doping level to a lower doping level, the doping concentration decreasing from the substrate to the first surface of the sensitive layer. According to an embodiment, over any distance across the sensitive layer which is half of the thickness of the sensitive layer, the ratio between the highest doping level and the lowest doping level is at least a factor 2, preferably at least a factor 3 or more.

The thickness of the sensitive layer may at least be 3 microns.

According to a first embodiment, the sensitive layer comprises a plurality of sub-layers. This plurality of sub-layers may be epitaxial sub-layers. Each of those sub-layer may have a different doping concentration.

The sensitive layer may have a continuously or gradually decreasing doping concentration or a stepwise decreasing doping concentration. The stepwise decreasing doping concentration may decrease step-wise monotonically.

The present invention also provides a MOS based pixel structure for detecting light, comprising a plurality of sensor structures according to the present invention, or an array of sensor structures according to the present invention.

The present invention furthermore provides a method to obtain sensor structures for detection of particles or electromagnetic radiation. This method comprises the steps of:
  providing a substrate with a major surface,
  on the major surface of the substrate, providing a sensitive layer having a first surface remote from the substrate, the sensitive layer being sensitive to particles or electromagnetic radiation, and
  providing the sensitive layer with a doping concentration gradient, the doping concentration decreasing from the substrate to the first surface of the sensitive layer.

The step of providing the sensitive layer may be such that over any distance across the thickness of the sensitive layer which is half of the thickness of the sensitive layer, the ratio between the highest doping level and the lowest doping level is at least a factor 2, preferably at least a factor 3 or more.

The step of providing a sensitive layer may either comprise providing a single sensitive layer, or providing a stack of a plurality of sub-layers. The sub-layers may be epitaxial layers. Each of the sub-layers may be provided with a different doping concentration.

These and other features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

FIG. 1 schematically shows a photodiode with a junction of n-type material in a p-type substrate, according to the prior art.

FIG. 2 schematically shows an array of photodiodes comprising a bulk wafer of highly doped p-type Silicon with on top of it an epitaxial layer of p-type Silicon provided with n-type collection regions, according to the prior art.

DESCRIPTION OF THE ILLUSTRATIVE EMBODIMENTS

The present invention will be described with respect to particular embodiments and with reference to certain drawings but the invention is not limited thereto but only by the claims. The drawings described are only schematic and are non-limiting. The drawings are not drawn to scale. The present invention will mainly be described with respect to photosensitive layers but the present invention is not limited thereto but may be applied to any layer which is sensitive to electromagnetic radiation and/or high energy particles. The sensitive layer preferably generates carriers such as electrons or holes when it is impacted with the electromagnetic radiation or the high energy particles. The sensitive layer is a semiconductor layer, e.g. a doped semiconductor such as silicon.

Figure 3:
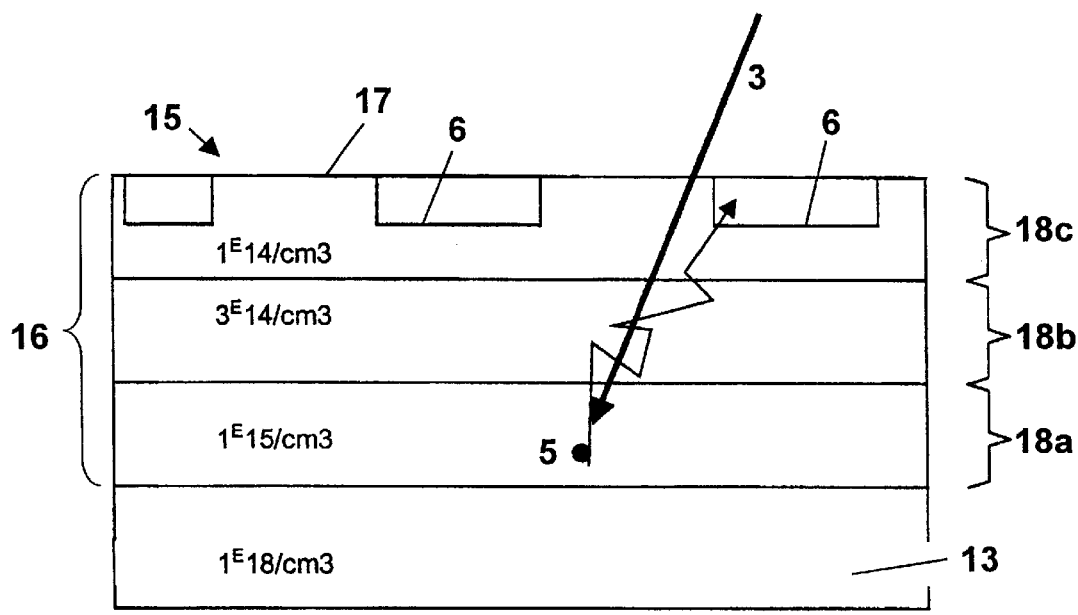
FIG. 3 schematically shows an array of photodiodes comprising a bulk wafer of highly doped p-type Silicon with on top of it a plurality of epitaxial layers of p-type Silicon with decreasing concentration, according to an embodiment of the present invention.

FIG. 3 schematically shows an array 15 of photodiodes according to the present invention. On a major surface of a highly doped bulk wafer 13 of for example p-type Silicon, e.g. with a doping level of 1e18/cm$^3$, a photosensitive layer 16 is provided. The photosensitive layer 16 comprises a decreasing doping concentration from the highly doped bulk wafer 13 towards a first surface 17 of the photosensitive layer 16 remote from the bulk wafer 13. In the example represented in FIG. 3, the photosensitive layer 16 comprises a plurality of epitaxial sub-layers 18a, 18b, 18c on top of each other, each epitaxial sub-layer 18a, 18b, 18c respectively, placed on top of a previous layer, having a decreasing doping concentration. This results in a stepwise change in doping concentration. In the example given in FIG. 3, epitaxial sub-layer 18a has a p-type doping concentration of 1e15/cm$^3$, epitaxial sub-layer 18b has a p-type doping concentration of 3e14/cm$^3$, and epitaxial sub-layer 18c has a p-type doping concentration of 1e14/cm$^3$. The doping levels of FIG. 3 for the highly doped bulk wafer 13 and for the epitaxial sub-layers 18a, 18b, 18c are given for the sake of example only, and are not intended to limit the scope of protection of the present invention. It lies within the normal skills of a skilled person to distinguish which other doping levels would be suitable for the epitaxial sub-layers 18a, 18b, 18c.

The photosensitive layer 16 can vary in the number of sub-layers 18a, 18b, 18c involved (ranging from 1 to a plurality), in the dopant concentrations of each of the sub-layers 18a, 18b, 18c, and in the thickness of each of the sub-layers 18a, 18b, 18c and of the layer 16 itself. The photosensitive layer is preferably at least 3 microns thick.

In an alternative embodiment, not represented in the drawings, the decrease in doping levels from the bulk wafer 13 towards the first surface 17 of an epitaxial layer placed on top of the bulk wafer 13, is not carried out in steps, but as a gradient function. For example, the concentration may change in a monotonically decreasing manner. According to the present invention, the gradient is such that over any distance within the epitaxial layer, which is half of the thickness of that layer, the concentration ratio between the highest doping level and the lowest doping level is at least a factor 3.

The effects of a structure according to the present invention, either with a step-wise decrease in doping levels, or with a gradient decrease in doping levels, is threefold. In a first aspect there is a faster collection of charge carriers such as electrons or holes. An electron generated deep in an epitaxial layer is influenced more by the vertical (if a device is being looked at as in FIG. 3) concentration differences than it can diffuse horizontally. This vertical movement is enhanced by there being a built-in field working on it caused by the differences in doping concentration. Thus the carriers are helped to move preferentially in one direction, and they are guided to their desired destination. There is anisotropic diffusion. In a second aspect, a deeper collection volume can be obtained for the same sharpness of a certain sensor structure. Indeed, as an electron generated in the epitaxial layer diffuses more upwardly than sidewards, thicker epitaxial layers can be used to obtain the same sharpness. In a third aspect, if the same thickness of epitaxial layer is used as in the prior art, better image sharpness is obtained.

To explain why the lack of sharpness decreases with a device according to the present invention, the case of a single epitaxial layer of e.g. 20 $\mu$m thickness and one single doping concentration is compared to the case of four epitaxial sub-layers on top of each other, with a thickness of 5 $\mu$m each, and with decreasing doping concentration. In the first case, the carrier diffusion is isotropic resulting in a sphere of unsharpness having roughly the same radius as the thickness of the epitaxial layer. In the example this would be 20 $\mu$m. In the second case, this does not apply, as the diffusion is not purely random but is guided by the built-in field due to the doping level gradient. As the consecutive epitaxial layers have a decreasing doping concentration, there are built-in electrostatic barriers between them. Once an electron reaches the next epitaxial layer (placed on top of the previous one, and having a lower doping concentration), it is very unlikely that it diffuses backwards into the previous one. The radius of unsharpness of the first epitaxial layer (the lowest, with the highest doping level) is 5 $\mu$m, as this is the thickness of that layer. From that point on, the traversal of the next layer can be considered as being independent from the previous one, thus again with a radius of unsharpness almost equal to the thickness of the epitaxial layer (5 $\mu$m), and so on for each of the epitaxial layers. As the diffusion in each of the epitaxial layers is independent of the diffusion in another epitaxial layer, the overall radius of unsharpness should not be calculated as a simple sum of the radiuses of unsharpness, but as a square root of the sum of squares. This means that for the example given, with for epitaxial layers on top of each other, each having a thickness of 5 $\mu$m, the radius of unsharpness is given by:

$$\sqrt{5^2+5^2+5^2} = \sqrt{100} = 10$$

The overall radius of unsharpness for the device of the example, corresponding to the present invention, is thus only 10 $\mu$m, while in the device of the example which corresponds to the prior art, it is 20 $\mu$m.

Further consequences are in the dark current.

The present invention also provides a method to obtain sensor structures for detection of particles or electromagnetic radiation. In a first step, a substrate is provided, having a major surface, as known in the prior art. If this substrate is a semiconductor substrate, it is highly doped. With highly doped is meant e.g. a doping level higher than 1e17/cm$^3$, e.g. a doping level of 1e18/cm$^3$ or any other suitable doping level known to a person skilled in the art. Alternatively, this substrate may be e.g. sapphire, quartz or glass.

On the major surface of this substrate, one epitaxial or other semiconductor layer or a plurality of epitaxial or other semiconductor sub-layers are transferred, grown or deposited. Each epitaxial or other semiconductor (sub-)layer may be a thin layer of a single crystalline semiconductor.

If the epitaxial layer, consisting of one single layer or a plurality of sub-layers, is transferred to a substrate, this may be done as follows. A first semiconductor substrate can be provided, onto which the epitaxial or other semiconductor layer with a desired doping profile can be grown or deposited. A carrier substrate is removably bonded to the top of the epitaxial layer. Thereafter, the first substrate is cleaved from the epitaxial or other semiconductor layer, and the epitaxial or other semiconductor layer together with the carrier are transferred to a second substrate. This second substrate may be an insulator. It can e.g. be sapphire, quartz or glass. The epitaxial or other semiconductor layer is bonded to the second substrate. Then the carrier is taken off, e.g. by dissolving a bonding layer using solvent. Depending on the material of the second substrate, the resulting device can collect particles or radiation from the bottom (surface side) or from the top.

This epitaxial or other semiconductor layer, consisting of one epitaxial or other semiconductor layer or a plurality of sub-layers, will form a sensitive layer when the device is ready.

Epitaxy is a process in which a thin crystalline layer is grown on a crystalline substrate. In epitaxial growth, the substrate acts as a seed crystal and the epitaxial film duplicates the structure (orientation) of the crystal. One advantage of epitaxy is that it offers a semiconductor device designer a means of controlling the doping profile beyond that available with ion implantation or diffusion since the doping of the epitaxial layer is independent of that of the substrate. Thus epitaxy can be used to create a lowly doped layer on a heavily doped substrate. Furthermore, dopant (acceptor/donor) concentrations in an epitaxial layer can be continuously or step-wise changed, decreased or increased, during growth. Epitaxial layer thicknesses can range from 0.5 μm to 500 μm.

Different epitaxial techniques are known, each with its own advantages and disadvantages, the most important ones of which are vapour-phase epitaxy (VPE), liquid-phase epitaxy (LPE) and molecular beam epitaxy (MBE). LPE is best suited for depositing multiple layers, while MBE can produce complex doping profiles.

For VPE, hydrogen gas $H_2$ and silicon tetrachloride $SiCl_4$ (and dopant elements) are fed into a quartz reactor tube which contains the wafers in a graphite susceptor. RF coils heat the graphite (and thus the wafers), but not the quartz reactor tube. Deposition occurs at a high temperature at which several chemical reactions take place when process gases flow into the chamber. The main chemical reaction taking place is classed as a hydrogen reduction of a gas:

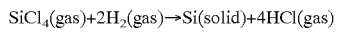
$SiCl_4(gas)+2H_2(gas) \rightarrow Si(solid)+4HCl(gas)$

As the temperature is controlled, the vapours produce the single crystal silicon layer on the wafer. The thickness and resistivity is controlled by the growth conditions and the required doping is added by releasing a specific amount of dopants in the main gas flow. After the layer is grown, the wafers are cooled down while still having the hydrogen flowing through. The wafers are then unloaded and oxidised to protect the surfaces of wafers from contaminates.

LPE is a method to grow semiconductor crystal layers from the melt on solid substrates. This happens at temperatures well below the melting point of the deposited semiconductor. A substrate is brought into contact with a saturated solution of the film material or a melt, at an appropriate temperature. The substrate is then cooled at a suitable rate to lead to film growth. At conditions that are close to the equilibrium between dissolution and deposition, the deposition of the semiconductor crystal on the substrate is slowly and uniform. The equilibrium conditions depend very much on the temperature and on the concentration of the dissolved semiconductor in the melt. The growth of the layer from the liquid phase can be controlled by a forced cooling of the melt. Impurity introduction can be strongly reduced. Doping can be achieved by the addition of dopants in the melt.

MBE is a deposition technique performed in ultra high vacuum to grow compound semiconductors. In MBE, atoms of an element or compound are delivered to a substrate through an ultra-pure, ultra-high vacuum (UHV) atmosphere. The UHV atmosphere provided by the MBE chamber allows the atoms to arrive on the substrate without colliding with other atoms or molecules. This keeps the growth free of other contaminants. The heated substrate surface allows the arriving atoms to distribute themselves evenly across the surface to form an almost perfect crystal structure. In MBE the substrate is placed in an UHV chamber with direct line of sight to several elemental species, each of which is in an evaporation furnace commonly referred to as an effusion cell. Through use of shutters and precise control of the effusion cell temperatures almost any material composition and doping can be achieved. Further, the composition may be controlled with a resolution of virtually one atomic layer. For the plurality of epitaxial or other semiconductor sub-layers, according to the present invention, each has a different doping concentration. After or during growing of the first epitaxial or other semiconductor sub-layer on a major surface of the substrate, this first epitaxial or other semiconductor sub-layer is doped to a certain, first, concentration, according to any suitable doping method known in the prior art, such as implantation, diffusion, or in situ doping (introduction of dopant atoms into the semiconductor during the epitaxial growth) as explained in the epitaxial techniques mentioned above. After providing a first doped epitaxial or other semiconductor sub-layer, a second epitaxial or other semiconductor sub-layer is grown on top of it, and again this second epitaxial or semiconductor sub-layer is doped with a certain doping level, at a second doping concentration, the second doping concentration being lower than the first doping concentration. Further epitaxial or other semiconductor sub-layers may be provided on top of the previous ones in the same way, each time with a lower doping concentration, until the desired total epitaxial layer thickness is reached. The differences in doping concentration between the different sub-layers are such that, over any distance of half the thickness of the epitaxial layer within that epitaxial layer, the ratio between the highest doping level and the lowest doping level is at least a factor 3. The thickness of the sensitive layer is preferably at least 3 microns.

Figure 6:
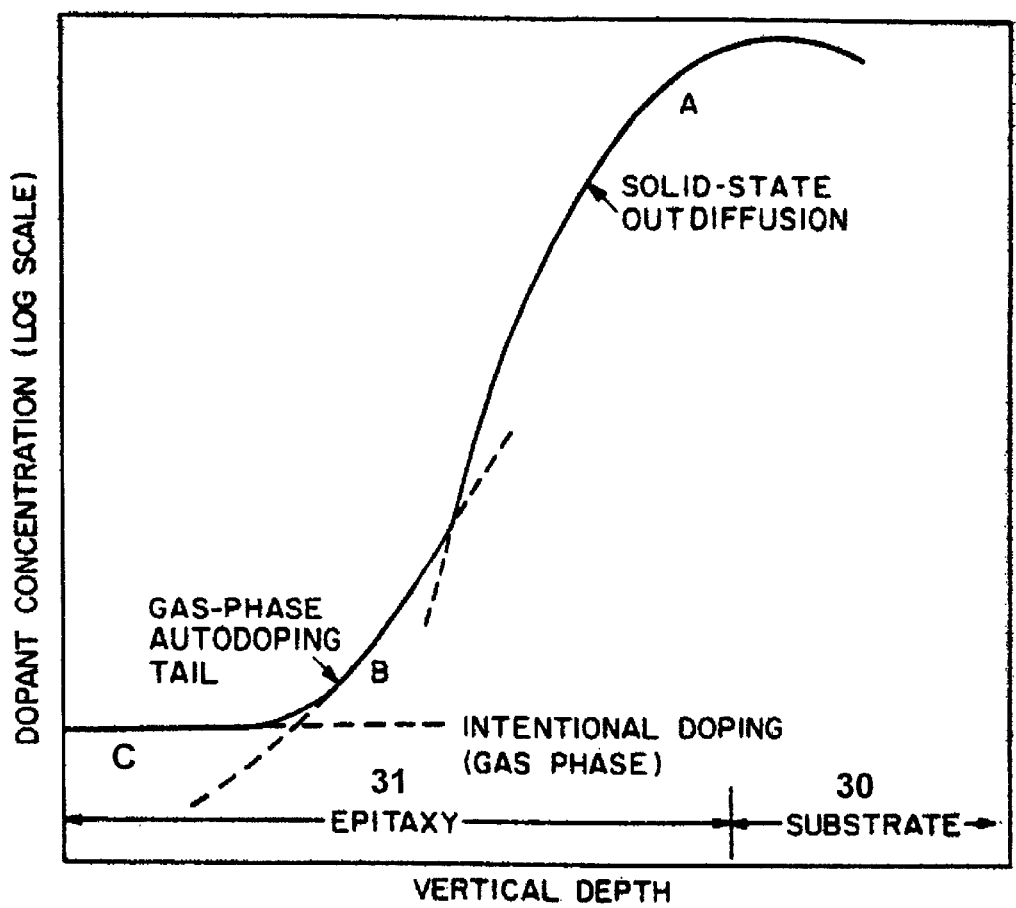
FIG. 6 is a graph of dopant concentration in function of vertical depth, at the interface between a highly doped substrate and a lower doped epitaxial layer, illustrating out-diffusion.

If a lower doped layer is placed on top of a higher doped layer (or substrate), out-diffusion and possibly autodoping take place. These are effects according to which, in addition to intentional dopants incorporated into the lower doped layer, unintentional dopants are introduced from the higher doped layer. Dopant is released from the higher doped layer through solid-state diffusion and evaporation. This dopant is reincorporated into the growing layer either by diffusion through the interface or through the gas phase. Out-diffusion is manifested as a transition region between the lower doped layer and the higher doped layer. FIG. 6 illustrates out-diffusion between a substrate 30 and an epitaxial layer 31. The shape of the doping profile close to the substrate 30, region A of the graph, is dominated by solid-state diffusion from the substrate 30. Because the growth velocity of the epitaxial layer 31 easily outpaces the diffusion of dopant, the doping profile in region B is dominated by dopant introduced from the gas phase. If the dopant evaporated from the substrate exceeds the intentional dopant, an autodoping tail develops. Autodoping is a time-dependent phenomenon. The dopant evaporating from the wafer surface is supplied from the wafer interior by solid-state diffusion. Once the autodoping is diminished, the intentional doping predominates, and the doping profile becomes flat, as shown in region C of the graph.

Out-diffusion automatically happens between two differently doped layers during deposition or thermal processing. Even if with MBE, virgin wafers with perfect doping steps are obtained, out-diffusion will take place during subsequent processing, when the wafer is heated. Out-diffusion typically takes place over a distance of less than 1 $\mu$m. The dopant concentration changes in accordance with the present invention generally extend over a distance larger than this value, e.g. at least 3 microns. However, the present invention includes within its scope the use of out-diffusion or autodoping in order to shape the dopant concentration profile.

If only one epitaxial layer is grown on the major surface of the substrate, it is doped, according to the present invention, with a gradient doping profile, whereby the highest doping level is located closest to the major surface of the substrate. In case of VPE, this is obtained by continuously decreasing the dopant concentration in the main gas flow. In case of LPE, this is obtained by continuously decreasing the dopant concentration in the solution or melt, or thus by adding Silicon. In case of MBE, this is obtained by continuously decreasing the dopant concentration in the molecular beam.

Figure 7:
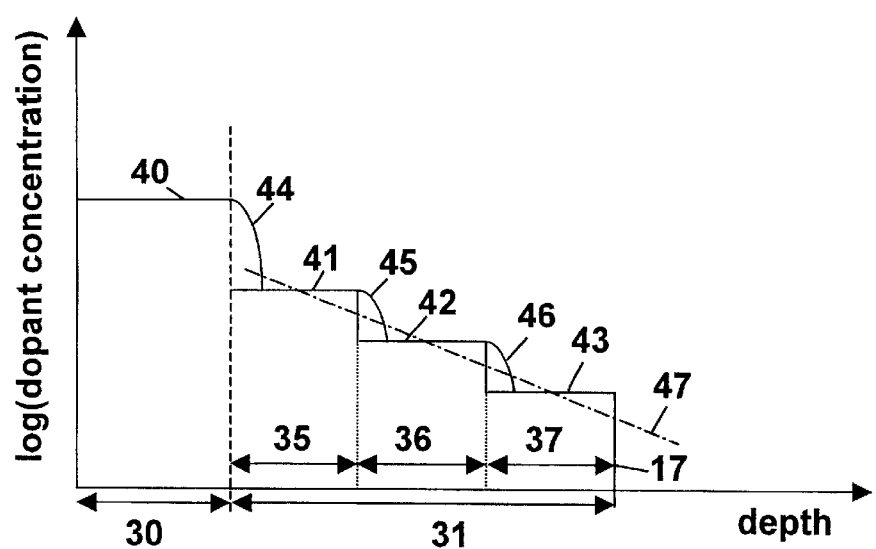
FIG. 7 is a graph of dopant concentration in function of depth in the device, showing different dopant concentrations for different epitaxial sub-layers.

A plurality of small epitaxial layers may be grown on top of each other, each having a step in the doping concentration with regard to a previously deposited epitaxial layer, whereby each step is diluted by out-diffusion so that, in the end result, there seems to be one epitaxial layer with a decreasing doping level. If each of the plurality of epitaxial layers is thicker than the out-diffusion region, then a dopant profile as shown in FIG. 7 is obtained. The substrate 30 has a high dopant concentration 40. For example three epitaxial sub-layers 35, 36, 37 are provided, together forming epitaxial layer 31, each sub-layer 35, 36, 37 having a different dopant concentration, the epitaxial sub-layer 35 closest to the substrate 30 having the highest dopant concentration 41 (lower than the dopant concentration 40 of the substrate 30), the middle epitaxial sub-layer 36 having a middle dopant concentration 42, and the epitaxial sub-layer 37 furthest away from the substrate 30 having the lowest dopant concentration 43. Out-diffusion 44 takes place from the substrate 30 to the abutting epitaxial sub-layer 35, and also out-diffusion 45, 46 takes place between each two neighbouring epitaxial sub-layers 35, 36 and 36, 37 respectively. An average of the dopant concentration over the sub-layers is given by line 47. It can be seen from FIG. 7 that the gradient due to out-diffusion 44 is steep, while the desired doping concentration gradient 47 according to the present invention has a much slower slope.

According to the present invention, the decrease in doping levels preferably takes place over a depth of at least 3 $\mu$m. Inside a layer, if it is thick enough, there is an out-diffusion region abutting a previous layer or a substrate, and a portion outside the out-diffusion region. For the part outside the out-diffusion region, there is, according to the present invention, a dopant concentration ratio of at least 3. The gradient due to out-diffusion is steep, while the to intended doping concentration gradient has a slower slope, as shown in FIG. 7.

The sensor structures according to the present invention, or the arrays of sensor structures according to the present invention, can be used e.g. for active pixels or for passive pixels for detection of electromagnetic radiation. An active pixel is configured with means integrated in the sensor pixel to amplify the charge that is collected on the light sensitive element or component in the sensor structure. Passive pixels do not have said means and require a charge-sensitive amplifier that is not integrated in the sensor structure and is connected with a long line towards the sensor structure.

Figure 4:
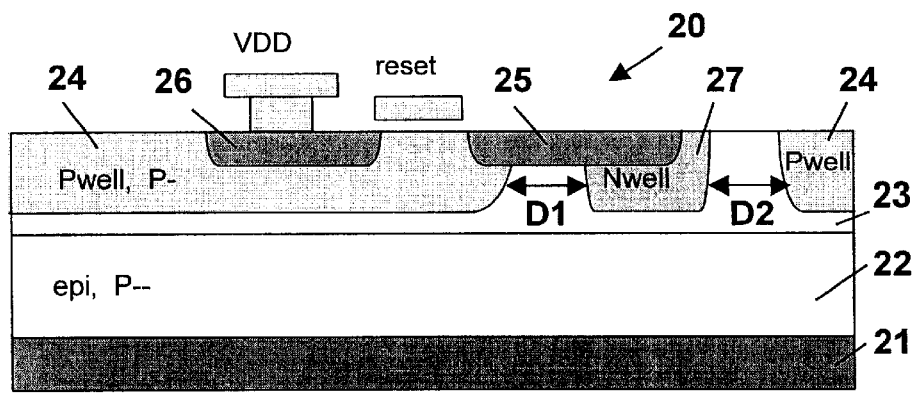
FIG. 4 schematically shows a vertical cross-section of an active pixel according to an embodiment of the present invention.

As an example, a specific embodiment of an active pixel 20 according to the present invention is represented in FIG. 4. In the example being described, it is assumed that the semiconductor substrate 21 is of a p type conductivity. It is obvious that a person skilled in the art will imagine equivalent structures to those described in the sequel that have a semiconductor substrate of a n type conductivity. Also other equivalent embodiments will be obvious for the person of skill in the art, the spirit and scope of the present invention being limited only by the terms of the appended claims.

Figure 5:
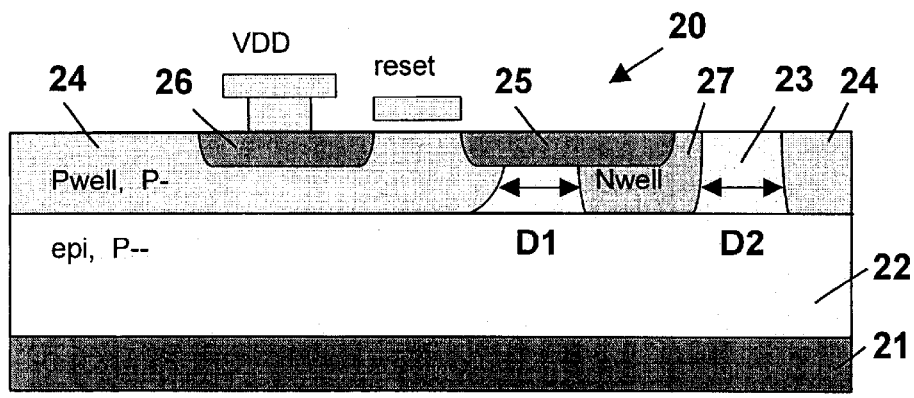
FIG. 5 schematically shows a vertical cross-section of an active pixel according to another embodiment of the present invention.

FIG. 4 schematically shows part of a pixel structure with the semiconductor substrate 21 having a p type doping. A p– layer or region 22 is defined in said substrate 21. The substrate 21 can be of a uniform p– or p++ doping either in alternate embodiments. The p– layer 22 can be defined by diffusion or by ion implantation or epitaxial growth or other techniques known in CMOS based processing. According to the present invention, a substrate layer 23 that is slightly lower doped than the p– region 22 is provided on top on that p– region 22. With slightly lower doped is meant a difference in doping levels of at least a factor 2. This slightly lower doped substrate layer 23 may be very thin, as shown in FIG. 5, where devices built into the thin substrate layer 23 touch the underlaying higher doped epitaxial layer 22, such that the lowly doped layer 23 is only present between the built-in devices. By including a slightly lower doped substrate layer 23, a potential barrier is created directly underneath the standard p-well to ensure that charge diffused to the upper regions of the silicon is kept within the lower doped region 23. This decreases optical crosstalk or unsharpness, which is the effect of charges generated underneath one pixel, but moving through the substrate and collected and read out by another pixel.

An additional p+ layer or region 24 is defined in the lowly doped layer 23. The p+ region 24 can be defined by diffusion or by ion implantation or epitaxial growth or other techniques known in CMOS based processing. In the p+ region 24 a first region 25 and a second region 26 are defined. These first and second regions 25, 26 are of an n type doping. These first and second regions 25, 26 can be defined by ion implantation or diffusion or other techniques known in CMOS based processing. These first and second regions 25, 26 form a junction with the p type based regions and/or substrate. The first region 25 is a collection junction for collecting the charge carriers being generated by radiation in any of the epitaxial layers 22 or 23. Said collection junction 25 has an enhanced collection for charge carriers that are generated in the radiation sensitive volume 22, 23 underneath other electronic components. Such functionality is made by means of an electrostatic barrier, that is formed at the interface of the epitaxial layer 23 and a region 24 with the same conductivity type as said epitaxial layer 23 underneath said other electronic components. The barrier prevents the charge carriers which are generated underneath said other electronic components from diffusing into the junctions 26 or structures of said other electronic components. According to the example, the collection junction 25 is a photodiode. The second region 26 is a junction being part of readout circuitry for processing the signals being generated by the charge carriers being collected by said first region 25. An additional, optional n type fourth region 27 can be defined and can overlap completely or partially said first region 25. This fourth region 27 extends from said first region 25 to one of the epitaxial layers 23, 22 underneath it and/or to said substrate 21. This fourth region 27 by preference is defined by a deep ion implantation step but may also be defined by other techniques known in CMOS based processing. The third region 24 and the fourth region 27 are such that there is a distance D1 between them, D1 being larger than zero. Also between the fourth region 27 of a pixel, and the third region 24 of a neighbouring pixel there is a distance D2, D2 being larger than zero.

By increasing the distances D1, D2 between the p-well layer 24 and the n-well layer 27, the peripheral parasitic capacitance of the junction n-well region and the p-well region is minimised by extending the size of the depletion layer around the n-well photodiode. The capacitance of a photodiode node is determined by the capacitance of the n-well plug 27 to the epi layer (area) 23 and to the p-well (perimeter) 24. By removing the p-well 24 in the direct environment of the n-well plug 27, the perimeter capacitance of the plug 27 becomes negligible. This technique therefore significantly reduces the total photodiode node capacitance and thus increases the conversion gain (charge to voltage conversion) proportionally. An increased sensitivity is thus obtained.

While the invention has been shown and described with reference to preferred embodiments, it will be understood by those skilled in the art that various changes or modifications in form and detail may be made without departing from the scope and spirit of this invention.

What is claimed is:

1. A particle or electromagnetic radiation sensor structure, comprising a substrate having a major surface, a sensitive layer on the major surface of the substrate, the sensitive layer creating charge carriers upon incidence of particles or electromagnetic radiation thereupon and having a first surface remote from the substrate, and a collector for collecting charge carriers and for transfer to read-out circuitry, wherein the sensitive layer has a doping concentration gradient from a higher doping level to a lower doping level, the doping concentration decreasing from the substrate to the first surface of the sensitive layer, the doping concentration gradient being such that over any distance across the sensitive layer which is half of the thickness of the sensitive layer, the ratio between the highest doping level and the lowest doping level is at least a factor 2.

2. A sensor structure we according to claim 1, wherein the thickness of the sensitive layer is at least 3 microns.

3. A sensor structure according to claim 1, wherein the sensitive layer comprises a plurality of sub-layers.

4. A sensor structure according to claim 3, wherein the plurality of sub-layers are epitaxial sub-layers.

5. A sensor structure according to claim 3, wherein each sub-layer has a different doping concentration.

6. A sensor structure according to claim 1, wherein the sensitive layer has a continuously decreasing doping concentration.

7. A sensor structure according to claim 1, wherein the decreasing doping concentration decreases stepwise.

8. An array of sensor structures for detecting particles or electromagnetic radiation, comprising a plurality of sensor structures, each sensor structure comprises a substrate having a major surface, a sensitive layer on the major surface of the substrate, the sensitive layer creating charge carriers upon incidence of particles or electromagnetic radiation thereupon and having a first surface remote from the substrate, and a collector for collecting charge carriers and for transfer to read-out circuitry, wherein the sensitive layer has a doping concentration gradient from a higher doping level to a lower doping level, the doping concentration decreasing from the substrate to the first surface of the sensitive layer, and the doping concentration gradient being such that over any distance across the sensitive layer which is half of the thickness of the sensitive layer, the ratio between the highest doping level an the lowest doping level is at least a factor 2.

9. A sensor structure according to claim 7, wherein the decreasing doping concentration decreases step wise monotonically.

10. An array according to claim 8, wherein the sensitive layer comprises a plurality of sub-layers.

11. An array according to claim 10, wherein the plurality of sub-layers are epitaxial sub-layers.

12. An array according to claim 10, wherein each sub-layer has a different doping concentration.

13. An array according to claim 8, wherein the decreasing doping concentration is continuously decreasing.

14. An array according to claim 8, wherein the decreasing doping concentration decreases stepwise.

15. A MOS based pixel structure for detecting light, comprising a plurality of sensor structures as recited in claim 1.

16. An array according to claim 8, wherein the thickness of the sensitive layer is at least 3 microns.

17. A method for operating an array of sensor structure comprising a sensitive layer sensitive to electromagnetic radiation and/or high energy particles, the method comprising:

impacting the sensitive layer with electromagnetic radiation or high energy particles, creating charge carriers in the sensitive layer upon impact of the electromagnetic radiation or high energy particles, controlling the direction of flow of the created charge carriers by means of a dopant concentration gradient in the sensitive layer, the doping concentration gradient being such that over any distance across the sensitive layer which is half of the thickness of the sensitive layer, the ratio between the highest doping level and the lowest doping level is at least a factor 2.

* * * * *